United States Patent
Blake (10) Patent No.: US 9,613,839 B2
(45) Date of Patent: Apr. 4, 2017

(54) CONTROL OF WORKPIECE TEMPERATURE VIA BACKSIDE GAS FLOW

(71) Applicant: Varian Semiconductor Equipment Associates, Inc., Gloucester, MA (US)

(72) Inventor: Julian G. Blake, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 374 days.

(21) Appl. No.: 14/548,183

(22) Filed: Nov. 19, 2014

(65) Prior Publication Data

US 2016/0141191 A1   May 19, 2016

(51) Int. Cl.
| | | |
|---|---|---|
| *C23F 1/00* | (2006.01) | |
| *H01L 21/306* | (2006.01) | |
| *H01L 21/67* | (2006.01) | |
| *G05B 19/418* | (2006.01) | |

(52) U.S. Cl.
CPC ...... *H01L 21/67248* (2013.01); *G05B 19/418* (2013.01); *H01L 21/67109* (2013.01); *G05B 2219/31001* (2013.01); *G05B 2219/45031* (2013.01)

(58) Field of Classification Search
CPC .................. H01L 21/67109; H01L 21/67248
USPC ............. 700/282; 438/540, 550; 156/345.27
See application file for complete search history.

(56) References Cited

U.S. PATENT DOCUMENTS

| | | | |
|---|---|---|---|
| 5,609,720 A | 3/1997 | Lenz et al. | |
| 6,290,274 B1 | 9/2001 | Montoya | |
| 6,303,895 B1 | 10/2001 | Husain et al. | |
| 6,378,600 B1 * | 4/2002 | Moslehi | C23C 14/50 |
| | | | 118/728 |
| 6,689,221 B2 * | 2/2004 | Ryding | C23C 14/505 |
| | | | 118/724 |
| 7,534,627 B2 * | 5/2009 | Michaelson | H01L 22/12 |
| | | | 219/444.1 |
| 2005/0133157 A1 | 6/2005 | Choi | |
| 2008/0227227 A1 | 9/2008 | Sundararajan et al. | |

OTHER PUBLICATIONS

International Search Report and Written Opinion mailed Feb. 5, 2016 in corresponding PCT application No. PCT/US2015/058061.

* cited by examiner

*Primary Examiner* — Mark Connolly (57) ABSTRACT

A system and method for modulating and controlling the localized temperature of a workpiece during processing is disclosed. The system uses a platen having one or more walls, defining a plurality of discrete regions on the top surface of the platen. When a workpiece is disposed on the platen, a plurality of compartments is created, where each compartment is defined by the back side of the workpiece and a respective region of the platen. The pressure of back side gas in each of the compartments can be individually controlled. The pressure of back side gas determines the amount of heat that is transferred from the workpiece to the platen. By locally regulating the pressure of back side gas, different regions of the workpiece can be maintained at different temperatures. In some embodiments, a plurality of valves is used to control the flow rate to the compartments.

15 Claims, 5 Drawing Sheets

CONTROL OF WORKPIECE TEMPERATURE VIA BACKSIDE GAS FLOW

FIELD

Embodiments of the present disclosure relate to systems and methods for controlling the temperature of a workpiece during processing, and more particularly, using variation in backside gas flow to locally control the workpiece temperature.

BACKGROUND

The fabrication of a semiconductor device involves a plurality of discrete and complex processes. One such process may be a etch process, where material is removed from the workpiece. Another process may be a deposition process, wherein material is deposited on the workpiece. Yet another process may be an ion implantation process where ions are implanted into the workpiece.

Further, in some embodiments, certain processes in the overall semiconductor fabrication process may have non-uniformities. For example, some processes, such as a chemical mechanical planarization (CMP) process may grind the workpiece in an uneven manner, such that more material is removed from some portions of the workpiece.

In some embodiments, certain processes may be used to correct for non-uniformities introduced earlier in the fabrication process. For example, the etch process, the deposition process or the ion implantation process may be used to correct for non-uniformities introduced in earlier processes. Additionally, these processes may be used to compensate for non-uniformities introduced in subsequent processes.

In some embodiments, these processes may be varied by performing the process for a greater time duration on certain portions of the workpiece. However, other mechanisms may also be used. In some embodiments, these processes may be sensitive to the temperature of the workpiece. For example, the amount of material processed in a certain time period may vary based on the temperature of the workpiece. Thus, by varying the temperature of the workpiece, these processes may be made non-uniform.

However, precise control of the workpiece temperature is non-trivial. Maintaining a temperature gradient between two adjacent portions of the workpiece may be difficult, as the workpiece and the platen serve to spread the heat.

Therefore, it would be beneficial if there were a system and method of controlling the temperature of a workpiece during processing. It would also be advantageous if the temperature can be independently controlled for a plurality of regions on the workpiece.

SUMMARY

A system and method for modulating and controlling the localized temperature of a workpiece during processing is disclosed. The system uses a platen having one or more walls, defining a plurality of discrete regions on the top surface of the platen. When a workpiece is disposed on the platen, a plurality of compartments is created, where each compartment is a closed volume defined by the back side of the workpiece and a respective region of the platen. The pressure of back side gas in each of the compartments can be individually controlled. The pressure of back side gas determines the amount of heat that is transferred from the workpiece to the platen. By locally regulating the pressure of back side gas, different regions of the workpiece can be maintained at different temperatures. In some embodiments, a plurality of valves is used to control the flow rate to the compartments.

In one embodiment, a system for controlling a temperature of a plurality of regions in a workpiece during processing is disclosed. The system comprises a platen comprising a top surface having one or more walls defining a plurality of discrete regions, wherein a plurality of compartments are created by the plurality of discrete regions when a workpiece is disposed on the platen, each compartment corresponding to a region of the workpiece, wherein each of the plurality of compartments has an associated opening; a plurality of conduits, each of the plurality of conduits in communication with a respective opening; a plurality of valves, each valve in communication with a respective one of the plurality of conduits and in communication with a back side gas supply system; and a controller, in communication with the plurality of valves, to independently control a flow rate through each of the plurality of valves so as to maintain a pressure within each of the plurality of compartments, wherein the pressure is selected so as to maintain a temperature of each region of the workpiece corresponding to a respective compartment.

In another embodiment, a system for controlling a temperature of a plurality of regions in a workpiece during processing is disclosed. The system comprises a platen comprising a top surface having one or more walls defining a plurality of discrete regions, wherein a plurality of compartments are created by the plurality of discrete regions when a workpiece is disposed on the platen, each compartment corresponding to a region of the workpiece; a back side gas supply system; and a controller, configured to independently regulate a flow rate from the back side gas supply system to each of the compartments.

According to another embodiment, a method controlling a temperature of a plurality of regions in a workpiece is disclosed. The method comprises disposing a workpiece on a platen, the platen comprising a top surface having one or more walls defining a plurality of discrete regions, wherein a plurality of compartments are created by the plurality of discrete regions when the workpiece is disposed on the platen, each compartment corresponding to a region of the workpiece, where each of the plurality of compartments is in communication with a back side gas supply system; and adjusting a pressure of back side gas in each of the plurality of compartments so as to independently control the temperature of the plurality of regions in the workpiece.

BRIEF DESCRIPTION OF THE FIGURES

For a better understanding of the present disclosure, reference is made to the accompanying drawings, which are incorporated herein by reference and in which.

DETAILED DESCRIPTION

As described above, semiconductor device fabrication includes various processes, including the etch process, the deposition process and ion implantation. One or more of these processes may be sensitive to temperature. In some embodiments, this temperature dependence may be used to improve the overall semiconductor fabrication process and its efficiency. In other words, rather than varying the time used to process certain regions of the workpiece, the temperature of the workpiece can be modulated. This allows the same result as increased time, without the decrease in efficiency.

One mechanism to vary the temperature of the workpiece may be to control the ability of the workpiece to dissipate heat to the platen. For example, typically, backside gas is disposed in the small volume between the backside of the workpiece and the platen. The pressure of this backside gas determines the amount of heat transfer that is achieved between the workpiece, which typically serves as the heat source, and the platen, which typically serves as the heat sink. In other words, greater backside gas pressure allows more heat to be transferred from the workpiece to the platen.

Figure 1:
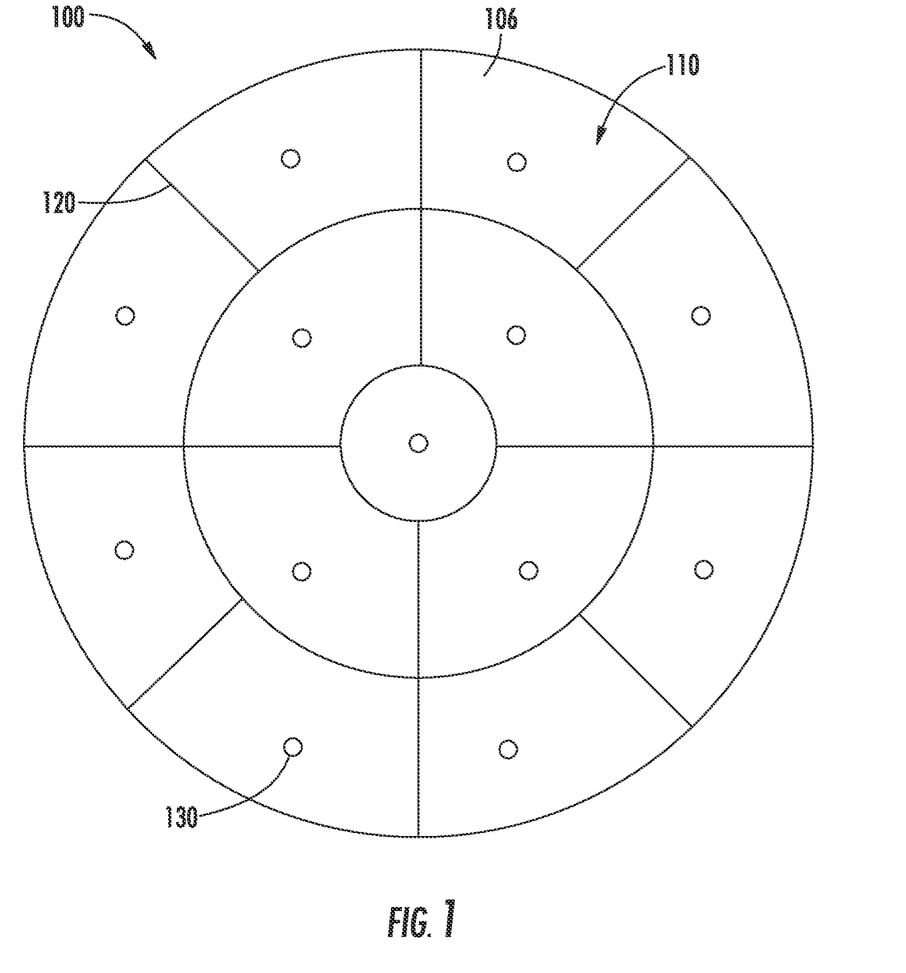
FIG. 1 is a top view of a platen according to one embodiment.

FIG. 1 shows a platen 100 according to one embodiment. The platen 100 includes a top surface 106, which is divided into a plurality of discrete regions 110 by one or more walls 120. The walls 120 completely enclose each of the discrete regions 110. Thus, the walls 120 define boundaries between adjacent discrete regions 110.

Although not shown, the platen 100 may also comprise an outer ring seal. This outer ring seal serves as a barrier for the back side gas, effectively forming a wall around the outer circumference of the platen to contain the back side gas. In some embodiments, one or more of the walls 120 may serve as the outer ring seal. For example, the outermost wall 120 may also serve as the outer seal ring. In some embodiments, the platen may also comprise a plurality of embossments (not shown). These embossments, which may be small circular protrusions, serve to support the workpiece and maintain the desired separation between the platen and the workpiece to allow the flow of back side gas.

These walls 120 may be part of the platen 100. In other words, in some embodiments, the walls 120 may be machined or etched into the top surface of the platen 100. In other embodiments, the walls 120 may be added to the top surface of the platen 100, such as via a patterned deposition via chemical vapor deposition (CVD), plasma vapor deposition (PVD), or plasma enhanced chemical vapor deposition (PECVD). In other embodiments, the walls 120 may be separate elements that are affixed to the top surface of the platen 100. For example, sealing rings may be used as the walls 120. Further, in some embodiments, a final lapping or polishing process may be performed to insure that all of the walls 120 are the same height. In one embodiment, the walls 120 may extend about 5 μm above the top surface of the platen 100.

While FIG. 1 shows a platen 100 having a total of thirteen discrete regions 110, the number of discrete regions 110 is not limited by the disclosure. The number of discrete regions 110 may be much larger, such as more than 150. Furthermore, the pattern of the discrete regions disposed on the top surface of the platen 100 may vary. While FIG. 1 shows a pattern of discrete regions 110 which are based on sectors of concentric circles, other patterns may be used as well. For example, a grid pattern may be used. In addition, other patterns based on sectors of concentric circles may be utilized. For example, the pattern may include a greater number of concentric circles, each having a respective number of sectors. Of course, the number of sectors in each concentric circle need not be identical. In some embodiments, the number of sectors for each concentric circle may be selected so that each discrete region 110 occupies roughly the same area of the workpiece. Additionally, although not shown, one or more embossments may be disposed in the discrete regions 110. For example, if a discrete region encompasses a large area, it may be beneficial to introduce one or more embossments to insure that the desired separation between the platen 100 and the workpiece is maintained.

Each of the discrete regions 110 has a respective opening 130, which is in communication with a respective valve and conduit. In this way, the backside gas may be delivered to each of the discrete regions 110, independent of other discrete regions 110. While one opening is shown, multiple openings may be included in one or more of the discrete regions.

Figure 2:
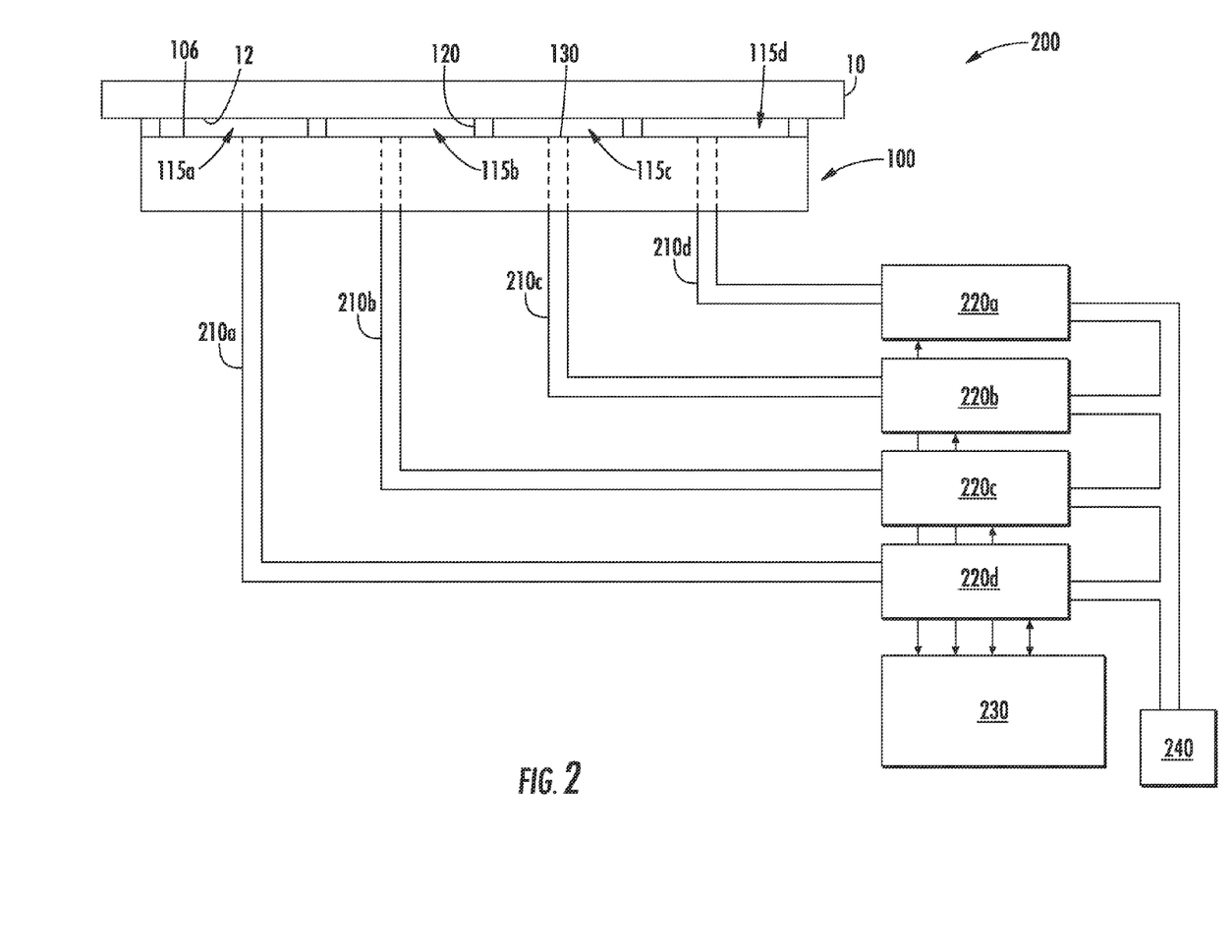
FIG. 2 is an embodiment of a temperature control system utilizing the platen of FIG. 1.

FIG. 2 shows a first embodiment of a system 200 using the platen 100 of FIG. 1. Specifically, a workpiece 10 having a back side 12 is disposed on the platen 100. The walls 120 contact the back side 12 of the workpiece 10, creating a plurality of compartments 115a-d. Each compartment 115 is a closed volume defined by the back side 12 of the workpiece 10 and a respective discrete region 110 in the platen 100. Therefore, the opening 130 in each respective discrete region 110 also serves as the passage into and from the compartment 115 defined in part by that discrete region 110. Although four such compartments 115a-d are shown, it is understood that the number of compartments 115 that are created is not limited by the disclosure.

Each discrete region 110, and consequently, each compartment 115a-d, is in communication with a respective conduit 210a-d. Each conduit 210a-d is in communication with a respective valve 220a-d.

Figure 4:
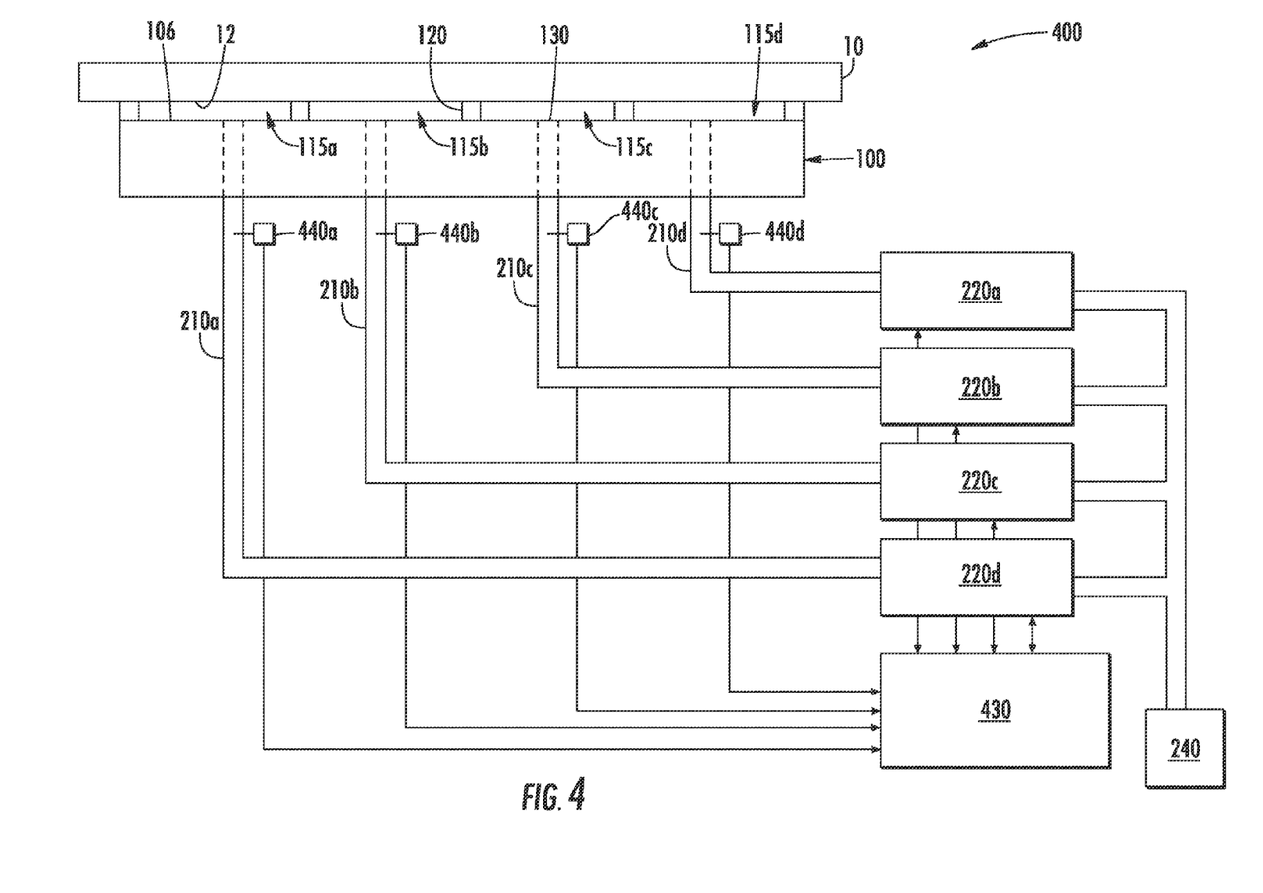
FIG. 4 is another embodiment of a temperature control system utilizing the platen of FIG. 1.

Although FIG. 2 shows the valves 220a-d disposed outside the platen 100, other embodiments are also within the scope of the disclosure. For example, in certain embodiments, micro-valves may be embedded in the platen 100. In other embodiments, the valves 220a-d may be external to the platen 100, as shown in FIGS. 2 and 4. Thus, the location of the valves 220a-d is not limited by the disclosure.

Each respective valve 220a-d may also be in communication with a back side gas supply system 240. Thus, the opening of a particular valve 220a-d allows back side gas to pass from the back side gas supply system 240 to the compartment 115a-d corresponding to that particular valve 220a-d.

Each of the valves 220a-d may be an analog valve or a digital valve. In the case of an analog valve, the valve can be opened to achieve an indicated percentage of the maximum flow rate. In the case of a digital valve, the valve is either completely open or completely closed. The flow rate of a digital valve is determined by the pulse rate and duty cycle of the valve openings. For example, a digital valve that is open 10% of the time will achieve a flow rate equal to 10% of the maximum flow rate.

Each of the valves 220a-d is also in communication with a controller 230. The controller 230 may comprise a processing unit in electrical communication with a storage element. The storage element may contain the instructions to be executed by the processing unit. The controller 230 also comprises a plurality of outputs, such as one output for each valve 220a-d, which indicates to that valve 220a-d the desired flow rate.

The temperature of the workpiece 10 in a particular region may be controlled by modulating the back side gas flow rate in the compartment 115 that corresponds with that region. In the embodiment shown in FIG. 2, the flow rate of the valves 220a-d may be accurately controlled by controller 230.

Additionally, the leak rate of back side gas from each compartment 115 may be accurately modeled or estimated.

The controller 230 may also receive other information. For example, the amount of thermal power supplied by the particular fabrication process per square centimeter of workpiece 10 may be input to the controller 230. This thermal power may be the thermal energy or heat imparted by a particular process, such as an etch process, an ion implantation process or a deposition process on the workpiece 10. In some embodiments, this power density may be between 0.1. and 10 W/cm$^2$. Additionally, the heat that can be extracted from the workpiece 10 by the back side gas may also be input. The rate that the heat may be extracted, also referred to as heat transfer coefficient (HTC), is dependent on the platen geometry and the species used for the back side gas. In some embodiments, the heat transfer coefficient is between 0.05 and 0.2 W/cm$^2$ ° C.

Thus, based on the known flow rate into a particular compartment 115 through its respective valve 220, and the leak rate of back side gas from that compartment 115, the pressure of the back side gas in that particular compartment 115 may be known and controlled by the controller 230. Further, the heat transfer coefficient of each compartment 115a-d may be derived based on the pressure of the back side gas in that compartment 115. In some cases, there may be a linear relationship between the back side gas pressure and the heat transfer coefficient. In other cases, other relationships may exist. In other words, based on the maximum HTC input to the controller 230, and the relationship between back side gas pressure and HTC, it is possible to determine the back side gas pressure that will generate a given heat transfer coefficient.

To decrease the temperature of a particular region of the workpiece 10 if the workpiece 10 is warmer than the platen 100, the controller 230 may increase the flow rate of the valve 220 in communication with the compartment 115 that corresponds to that particular region of the workpiece 10. This increases the heat transfer coefficient, allowing more coupling between the workpiece 10 and the platen 100. Conversely, to increase the temperature of a particular region of the workpiece 10 if the workpiece 10 is warmer than the platen 100, the controller 230 may decrease the flow rate of the valve 220 in communication with the compartment 115 that corresponds to that particular region of the workpiece 10, decreasing the heat transfer coefficient in that compartment 115.

In some embodiments, the platen 100 may be used to heat the workpiece 10 to a higher temperature. In this embodiment, the operations described above are reversed. Specifically, to decrease the temperature of a particular region of the workpiece if the workpiece 10 is cooler than the platen 100, the controller 230 may decrease the flow rate of the valve 220 in communication with the compartment 115 that corresponds to that particular region of the workpiece 10. This decreases the heat transfer coefficient, allowing less coupling between the workpiece 10 and the heated platen. Conversely, to increase the temperature of a particular region of the workpiece 10 if the workpiece 10 is cooler than the platen 100, the controller 230 may increase the flow rate of the valve 220 in communication with the compartment 115 that corresponds to that particular region of the workpiece 10, increasing the heat transfer coefficient in that compartment 115.

Figure 3:
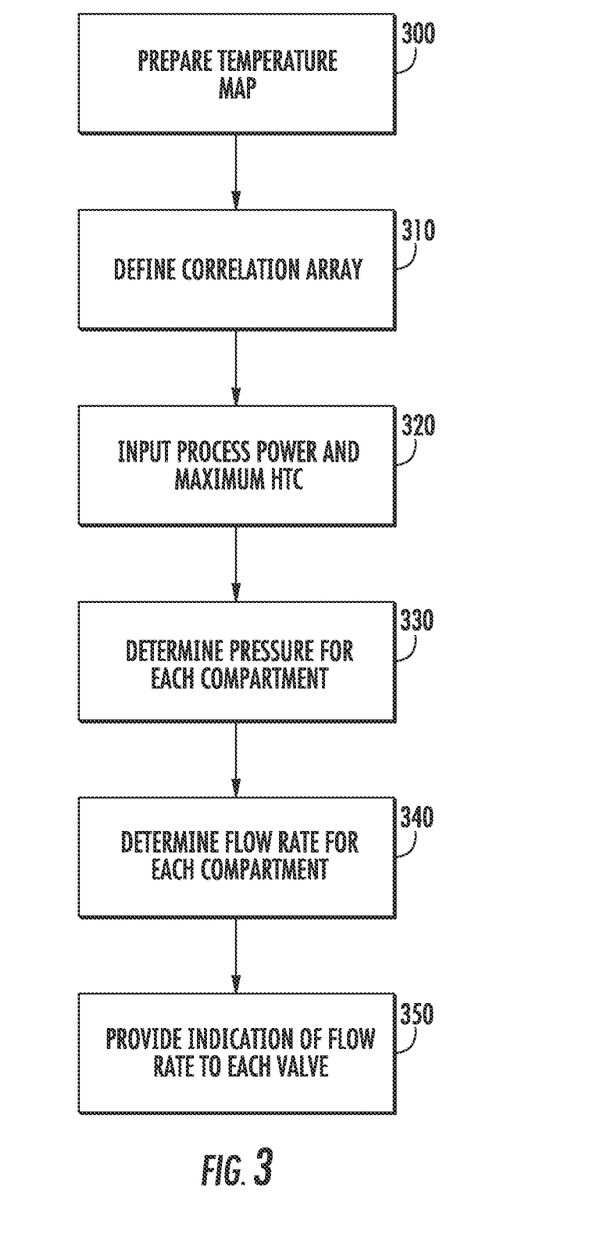
FIG. 3 is a flowchart showing the operation of the system of FIG. 2.

FIG. 3 shows a flowchart of an operation of the system 200 of FIG. 2. In operation, a desired temperature map may be prepared for the workpiece 10, as shown in operation 300. This desired temperature map may represent the desired temperatures in different regions of the workpiece 10 during an etching process. This temperature map may be input to the controller 230. Further, the controller 230 may also contain a correlation array, as shown in operation 310, which is used to map a particular region of the workpiece 10 to one or more compartments 115.

The controller 230 may also receive additional inputs. For example, the thermal power supplied by the process, which may depend on various factors, may be supplied to the controller 230. as described above, this thermal power may be the thermal energy or heat imparted by a particular process, such as an etch process, an ion implantation process or a deposition process on the workpiece 10. Additionally, the maximum heat transfer coefficient, which may be based on the species used as the back side gas, may also be input to the controller 230, as shown in operation 320. These parameters may be determined based on modeling, or based by empirical measurements performed on other workpieces.

Based on the temperature map, the correlation array, the process thermal power and the maximum heat transfer coefficient, the controller 230 may determine the desired back side gas pressure for each compartment 115 of the platen, as shown in operation 330. Based on the desired temperature of each region of the workpiece 10, the determined back side gas pressure, the heat supplied by the process, the maximum heat transfer coefficient and the leak rate of that compartment 115, the desired flow rate of back side gas to that compartment 115 may be determined by the controller 230, as shown in operation 340. The controller 230 then provides an indication of that flow rate to the valve 220 corresponding to that compartment 115, as shown in operation 350. In some embodiments where digital valves are utilized, this indication may represent the desired duty cycle of the valve. In other embodiments, this indication may be a analog voltage, representative of the percentage that the valve should be open.

This sequence is executed by the controller 230 for each compartment 115a-d. In this embodiment, there is no feedback to the controller 230 indicating the actual pressure in each compartment 115a-d. Thus, in this embodiment, the controller 230 operates using open loop control.

The previous description indicated that the valves 220 may operate in one of two modes. In one mode, the valve 220 is open and back side gas is passed from the back side gas supply system 240 to the respective compartment 115. In the second mode, the valve 220 is closed and there is no flow of back side gas. In some embodiments, the valves 220a-d may allow three modes of operation. In the third mode, the valve may be used to exhaust backside gas from the respective compartment 115. For example, in certain embodiments, the desired temperature of the workpiece 10 may utilize a back side pressure in the compartment 115 that is less than the pressure that is currently in that compartment 115. Therefore, to achieve the desired temperature, it may be beneficial to remove the back side gas from the compartment 115 faster than occurs via leakage. In this third mode, the back side gas from the compartment 115 may be exhausted back into a vacuum atmosphere.

FIG. 4 shows a second embodiment of a system 400 using the platen 100 of FIG. 1. In this embodiment, a pressure sensor 440a-d is disposed in each compartment 115a-d or conduit 210a-d. These pressure sensors 440a-d are coupled to the controller 430, which is also in communication with valves 220a-d. This controller 430 comprises a processing unit and a storage element, as described previously.

In this embodiment, the controller 430 utilizes closed loop control, using the valves 220a-d and the associated pressure sensors 440a-d to insure the desired back side pressure is maintained in each respective compartment 115a-d.

Figure 5:
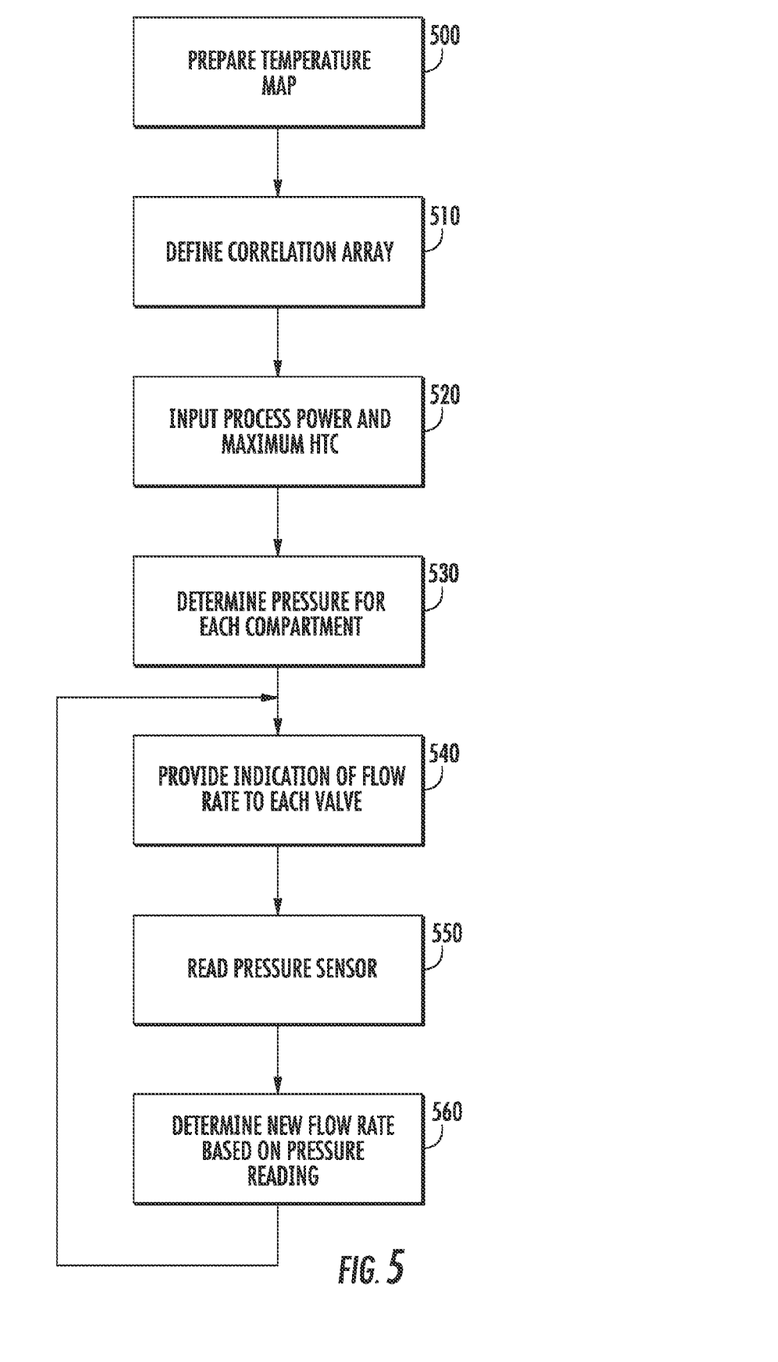
FIG. 5 is a flowchart showing the operation of the system of FIG. 4.

The system 400 of FIG. 4 operates similar to that of FIG. 2, except the controller 430 performs closed loop control of the pressure in each compartment 115a-d. FIG. 5 shows the sequence used in this embodiment. As before, a desired temperature map may be prepared for the workpiece 10, as shown in operation 500. This desired temperature map may represent the desired temperatures in different regions of the workpiece 10 during the etching process. This temperature map may be input to the controller 430. Further, the controller 430 may also contain a correlation array, which is used to map a particular region of the workpiece 10 to one or more compartments 115, as shown in operation 510.

In addition, as described with respect to FIG. 3, the thermal power supplied by the process and the maximum heat transfer coefficient may be input to the controller 430, as shown in operation 520.

Based on the temperature map and the correlation array, the thermal power supplied by the process and the maximum heat transfer coefficient, the desired pressure of back side gas in that compartment 115 may be determined by the controller 430, as shown in operation 530. The controller 430 then provides an indication of a flow rate to the valve 220 corresponding to that compartment 115, as shown in operation 540. In some embodiments where digital valves are utilized, this indication may represent the desired duty cycle of the valve. In other embodiments, this indication may be an analog voltage, representative of the percentage that the valve should be open.

The controller 430 then reads the value of pressure sensor 440, as shown in operation 550. The controller 430 then calculates a new flow rate based on the current flow rate and the pressure reading, as shown in operation 560. The controller 430 then adjusts the flow rate of the valve 220 and monitors the pressure of the compartment 115 until the pressure in the compartment 115 reaches the desired level. This is achieved by the controller 430 by repeatedly reading the pressure sensor 440, determining a new flow rate and applying an indication of that flow rate to the valve 220.

In this embodiment, as was previously described, the valve 220 may operate in one of two modes, or may operate in one of three modes.

The use of variable back side gas pressure improves localized temperature control of a workpiece. Other systems attempt to regulate workpiece temperature by inducing different temperatures on different regions of the platen, such as through the use of embedded heating zones. However, when the embedded heating zones are used to create temperature differentials on the surface of the platen, thermal stresses may be induced on the platen. In one instance, the present system allows the platen to be maintained at a constant temperature, absent any thermal stress, and to achieve localized temperature control based on localized heat transfer between the platen and the workpiece. In another instance, the present system can be used with a platen with embedded heating zones for additional temperature control.

Further, this system and method allow any number of compartments to be created, each of which corresponds to a certain region of the workpiece. Thus, the localized temperature of the workpiece may be precisely and finely controlled.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for controlling a temperature of a plurality of regions in a workpiece during processing, comprising:
a platen comprising a top surface having one or more walls defining a plurality of discrete regions, wherein a plurality of compartments are created by the plurality of discrete regions when a workpiece is disposed on the platen, each compartment corresponding to a region of the workpiece, wherein each of the plurality of compartments has an associated opening;
a plurality of conduits, each of the plurality of conduits in communication with a respective opening;
a plurality of valves, each valve in communication with a respective one of the plurality of conduits and in communication with a back side gas supply system; and
a controller, in communication with the plurality of valves, to independently control a flow rate through each of the plurality of valves so as to maintain a pressure within each of the plurality of compartments, wherein the pressure is selected so as to maintain a temperature of each region of the workpiece corresponding to a respective compartment.

2. The system of claim 1, wherein the plurality of valves comprise digital valves, where the controller modulates a duty cycle of each valve to control the flow rate.

3. The system of claim 1, wherein the plurality of valves operates in one of two modes, a first mode where back side gas flows through the valve toward the respective compartment and a second mode where flow is stopped.

4. The system of claim 1, wherein the plurality of valves operates in one of three modes, a first mode where back side gas flows through the valve toward the respective compartment, a second mode where flow is stopped and a third mode where the back side gas flows out of the respective compartment.

5. The system of claim 1, wherein the controller uses open loop control to control the flow rate.

6. A system of claim 1, further comprising a plurality of pressure sensors, each of the plurality of pressure sensors in communication with a respective compartment.

7. The system of claim 6, wherein the plurality of valves operates in one of two modes, a first mode where back side gas flows through the valve toward the respective compartment and a second mode where flow is stopped.

8. The system of claim 6, wherein the plurality of valves operates in one of three modes, a first mode where back side gas flows through the valve toward the respective compartment, a second mode where flow is stopped and a third mode where back side gas flows out of the respective compartment.

9. The system of claim 6, wherein the controller uses pressure information from the plurality of pressure sensors to adjust the flow rate of a respective valve.

10. A system for controlling a temperature of a plurality of regions in a workpiece during processing, comprising:

a platen comprising a top surface having one or more walls defining a plurality of discrete regions, wherein a plurality of compartments are created by the plurality of discrete regions when a workpiece is disposed on the platen, each compartment corresponding to a region of the workpiece;

a back side gas supply system; and a controller, configured to independently regulate a flow rate from the back side gas supply system to each of the compartments.

11. A method of controlling a temperature of a plurality of regions in a workpiece, comprising:

disposing a workpiece on a platen, the platen comprising a top surface having one or more walls defining a plurality of discrete regions, wherein a plurality of compartments are created by the plurality of discrete regions when the workpiece is disposed on the platen, each compartment corresponding to a region of the workpiece, where each of the plurality of compartments is in communication with a back side gas supply system; and adjusting a pressure of back side gas in each of the plurality of compartments so as to independently control the temperature of the plurality of regions in the workpiece.

12. The method of claim 11, wherein the adjusting comprises regulating a flow rate of back side gas from the back side gas supply system to each of the plurality of compartments.

13. The method of claim 12, further comprising
inputting a desired temperature map to a controller; and
inputting a thermal power supplied by a process to the controller, wherein the controller determines a desired pressure of back side gas in each of the plurality of compartments based on the desired temperature map and the thermal power supplied by the process.

14. The method of claim 13, further comprising inputting a maximum heat transfer coefficient to the controller, wherein the controller regulates the flow rate of back side gas based on the maximum heat transfer coefficient.

15. The method of claim 13, further comprising:
measuring a pressure in each of the plurality of compartments using a pressure sensor; and
regulating the flow rate of back side gas to each of the plurality of compartments based on the measured pressure and the desired pressure of back side gas.

* * * * *